(12) United States Patent
Fukuda et al.

(10) Patent No.: US 6,764,963 B2
(45) Date of Patent: Jul. 20, 2004

(54) MANUFACTURING METHOD OF SEMICONDUCTOR DEVICES

(75) Inventors: Kenji Fukuda, Ibaraki (JP); Junji Senzaki, Ibaraki (JP); Ryoji Kosugi, Ibaraki (JP); Kazuo Arai, Ibaraki (JP); Seiji Suzuki, Moriguchi (JP)

(73) Assignees: National Institute of Advanced Industrial Science and Technology, Tokyo (JP); part interest; Sanyo Electric Co., Ltd., Moriguchi (JP); part interest (*) Notice: Subject to any disclaimer, the term of this patent is extended or adjusted under 35 U.S.C. 154(b) by 0 days.

(21) Appl. No.: 10/101,318

(22) Filed: Mar. 20, 2002

(65) Prior Publication Data

US 2003/0013266 A1 Jan. 16, 2003

(30) Foreign Application Priority Data

Aug. 27, 2001 (JP) .......................................... 2001-256973

(51) Int. Cl.[7] .......................... H01L 21/31; H01L 21/469
(52) U.S. Cl. ........................ 438/778; 770/773; 770/787; 770/931; 770/197
(58) Field of Search ............................... 438/770, 773, 438/778, 787, 910, 931, 197

(56) References Cited

U.S. PATENT DOCUMENTS

| 6,136,727 A | * | 10/2000 | Ueno ......................... 438/770 |
| 6,265,326 B1 | * | 7/2001 | Ueno ......................... 438/767 |
| 6,559,068 B2 | * | 5/2003 | Alok et al. ................. 438/770 |
| 2001/0038108 A1 | * | 11/2001 | Kitabatake et al. ......... 257/289 |

FOREIGN PATENT DOCUMENTS

| JP | 7-131016 | 5/1995 |
| JP | 9-199497 | 7/1997 |
| JP | 10-112460 | 4/1998 |
| JP | 11-31691 | 2/1999 |
| JP | 2000-252461 | 9/2000 |

* cited by examiner

Primary Examiner—Vu A. Le
Assistant Examiner—Beth E. Owens
(74) Attorney, Agent, or Firm—Oblon, Spivak, McClelland, Maier & Neustadt, P.C.

(57) ABSTRACT

A semiconductor device is manufactured using a SiC substrate. On a semiconductor region a region formed of SiC having an (11-20) face orientation is formed. A gate insulation layer is a gate oxidation layer. The surface of the semiconductor region is cleaned, and the gate insulation layer is formed in an atmosphere containing hydrogen or water vapor. After the gate insulation layer has been formed, the substrate is heat-treated in an atmosphere containing hydrogen or water vapor. This reduces the interface-trap density at the interface between the gate oxidation layer and the semiconductor region.

80 Claims, 11 Drawing Sheets

(a) ION IMPLANTATION FOR SOURCE/DRAIN FORMATION (b)

MANUFACTURING METHOD OF SEMICONDUCTOR DEVICES

BACKGROUND OF THE INVENTION

1. Field of the Invention

This invention relates to a method of manufacturing a semiconductor device on a silicon carbide substrate having a prescribed crystal plane orientation. It particularly relates to a method of manufacturing a semiconductor device that uses a gate insulation layer, such as a metal-oxide semiconductor (MOS) capacitor or a MOS field-effect transistor (MOSFET).

2. Description of the Prior Art

The interface-trap density of an oxide-silicon carbide interface using a silicon carbide (SiC) substrate is roughly ten times higher than that of a silicon MOS transistor. This gives rise to the problem that a SiC substrate based MOSFET has a lower channel mobility than a silicon substrate based MOSFET. In particular, a bulk SiC substrate having the crystal structure referred to as 4H-SiC has about twice the channel mobility of a bulk SiC substrate having the crystal structure referred to as 6H-SiC, so it should be possible to utilize this to lower the on-resistance of a power MOSFET. However, a 4H-SiC oxide/SiC interface has more defects (a higher interface-trap density) than a 6H-SiC one, and as a result, the 4H-SiC structure has a lower channel mobility. Therefore, in order to realize a SiC MOSFET having a low on-resistance, it is critically important to reduce the interface-trap density of a 4H-SiC MOS structure. A SiC MOSFET formed on the (0001) face usually has a channel mobility of not more than 10 $cm^2/Vs$.

There are reports of the channel mobility being improved to 30 $cm^2/Vs$ by reducing the interface-trap density by using $H_2O$ (water) to form a gate insulation layer on the (11-20) face of the SiC. It is already known that using the (11-20) face is more advantageous than using the (0001) face. However, this is still not enough, since a channel mobility of 100 $cm^2/Vs$ or more is required to reduce the SiC power MOSFET on-resistance to the theoretical value.

This being the case, efforts have focused on improving the interface between the semiconductor substrate and the gate insulation layer. In most cases, such efforts involve using heat treatment to reduce the interface-trap density. As described below, a number of disclosures have been made relating to the method of oxidizing the SiC substrate and the heat-treatment method used following the oxidation.

JP-A HEI 9-199497, for example, discloses a method of improving a thermal oxidation film of a SiC single-crystal substrate by following the oxidation step with an annealing step using hydrogen and an annealing step using inert gas, to thereby reduce hysteresis and flat band-shift. In particular, this publication describes a method in which the SiC oxidation is followed by hydrogen annealing at 1000° C. This method relates to the (0001) face of a SiC substrate; the disclosure does not describe a method relating to the (11-20) face. Moreover, a temperature of 1000° C. is too high, with the oxidation layer being reduced by the hydrogen, degrading the reliability of a device in which the oxidation layer is used as a gate oxidation layer.

JP-A HEI 10-112460 discloses a SiC semiconductor device fabrication method in which, to reduce the interface-trap density after forming a thermal oxidation layer, the thermal oxidation layer is subjected to less than two hours of annealing in an inert gas atmosphere and heat-treated at a low temperature of 300° C. to 500° C. in hydrogen or a gas, such as water vapor, containing hydrogen atoms. This is then followed by a cooling period, at least part of which takes place in a gaseous atmosphere containing hydrogen atoms. So, the publication specifically describes a method in which the gate oxidation layer is formed and heat-treated at 300° C. to 500° C. in an atmosphere containing hydrogen atoms, but it is a method that relates to the (0001) face of a SiC substrate, and contains no description relating to the (11-20) face. Also, the heat treatment temperature within the range 300° C. to 500° C. is too low for adequate heat-treatment.

JP-A HEI 11-31691 discloses a method of forming a thermal oxidation layer in a SiC semiconductor device in which, in order to reduce the interface-trap density after forming the layer, (1) in a method of forming a thermal oxidation layer in which the silicon dioxide is grown by a pyrogenic oxidation process that performs thermal oxidation introducing hydrogen and oxygen, a hydrogen-oxygen mixture is used, in which there is more oxygen than hydrogen, or (2) after oxidation, cooling is conducted in an atmosphere containing hydrogen atoms using a cooling rate within the range 0.3 to 3° C./min, or (3) after oxidation and cooling, extraction is effected at a temperature of not more than 900° C. While the disclosure does describe a method of cooling in an atmosphere containing hydrogen after the pyrogenic oxidation, it is a method that relates to the (0001) face of a SiC substrate, and does not describe the method with respect to the (11-20) face. Also, the described mixture ratio of hydrogen and oxygen used in the pyrogenic method is not optimal.

JP-A 2000-252461 describes a semiconductor device fabrication method in which one, or two or more oxide and/or nitride gate insulation layers are formed on at least the topmost layer of a SiC semiconductor substrate and then annealed at 600° C. to 1600° C. in an atmosphere containing hydrogen. In this method, a good gate insulation layer-SiC interface able to adequately stand up to actual use can be obtained by using hydrogen to terminate silicon or carbon dangling bonds that exist in the interface to thereby adequately reduce the interface-trap density. While the disclosure does describe the use of heat-treatment in hydrogen after forming the oxide layer on the SiC substrate, the method relates to the (0001) face of a SiC substrate and is not described with reference to the (11-20) face.

JP-A HEI 7-131016 relates to a field-effect transistor formed of hexagonal SiC crystal having a high power conversion capacity and to a method for manufacturing the transistor, in which the high power conversion capacity is attained by reducing the leakage current between the source and the drain when the gate voltage is off and reducing the electrical resistance when the gate voltage is on. For this, the main current flow path, meaning the current flow between source and drain in the case of a field-effect transistor, is formed parallel to the (0001) face and the channel formation surface is formed parallel to the (11-20) face. While the disclosure does describe the fabrication of a MOSFET structure characterized by the channel formation surface being parallel to the (11-20) face of hexagonal single-crystal SiC substrate, it does not describe a method of forming the gate oxidation layer of a MOSFET.

United States of America Patent (U.S. Pat. No. 5,972,801) discloses a method of improving the performance of an oxide-based device by obtaining an improved oxide layer. The method reduces defects in the oxide layer on the SiC substrate by using a process in which the oxide layer is exposed to an oxidizing atmosphere at a temperature that is not high enough to cause further oxidation of the SiC substrate but is high enough for diffusing the oxidation source gas within the oxides, and for a time that is not long enough to cause further oxidation of the SiC substrate but is long enough to enhance the characteristics of the interface between the oxidation layer and the substrate by increasing the density of the oxidation layer. The disclosure describes a method of processing the formed gate oxidation layer at 600° C. to 1000° C. in an atmosphere containing $H_2O$ (water), but in this case the $H_2O$ used is not formed by the combustion of $H_2$ and $O_2$, but is $H_2O$ vapor produced by heating pure water. Moreover, the method as described does not relate to formation of a gate oxidation layer on the (11-20) face followed by heat-treatment.

Thus, SiC MOSFETs have usually been formed on the (0001) face, but the channel mobility of such devices has not exceeded 10 $cm^2$/Vs. Also, the literature contains examples of channel mobility being improved to 30 $cm^2$/Vs by reducing the interface-trap density by using $H_2O$ (water) to form a gate oxidation layer on the (11-20) face of the SiC, and it is known that it is more advantageous to use the (11-20) face than the (0001) face. The (0001) and (000-1) faces are typical SiC faces. The (0001) face is also called the Si face and the (000-1) face is also called the C face. The oxidation rate in the case of the (000-1) face is approximately ten times higher than that in the case of the (0001) face. The properties of the (11-20) face are midway between the Si face and the C face, and is also more or less midway between the Si and C faces in terms of oxidation rate. Therefore, in the case of the (11-20) face, it is necessary to optimize the oxidation conditions and post-oxidation annealing conditions.

In view of the above, an object of the present invention is to provide a SiC semiconductor device using a SiC substrate with an orientation of the (11-20) face superior to the (0001) face, in which the device is given high channel mobility by optimizing the method of heat-treatment used following gate oxidation.

SUMMARY OF THE INVENTION

The first gist of the present invention to attain the above object is to provide a method of manufacturing a semiconductor device relating particularly to heat treatment that follows formation of a gate insulation layer, and comprising a step of forming a gate insulation layer on a semiconductor region formed of SiC having an (11-20) face orientation, a step of forming a gate electrode on the gate insulation layer, a step of forming an electrode on the semiconductor region, a step of cleaning the semiconductor region surface, a step of forming a gate insulation layer, and a step of reducing interface-trap density of an interface between the gate insulation layer and the semiconductor region by following the forming of the gate insulation layer by heat-treatment in an atmosphere containing not less than 1% of $H_2$ (hydrogen) or $H_2O$ (water).

The second gist of the invention is to provide a method of manufacturing a semiconductor device relating particularly to heat treatment that follows formation of a gate insulation layer, wherein in addition to the first gist, the atmosphere containing $H_2$ (hydrogen) can be a mixture of $H_2$ (hydrogen) and inert gas in which the $H_2$ (hydrogen) has a predetermined concentration of from 1% to 100%.

The third gist of the invention is to provide a method of manufacturing a semiconductor device relating particularly to heat treatment that follows formation of a gate insulation layer, wherein in addition to the first gist, the atmosphere containing $H_2O$ (water) can be a mixture of $H_2O$ (water) and inert gas in which the $H_2O$ (water) has a predetermined concentration of from 1% to 100%

The fourth gist of the invention is to include, in addition to the first, second or third gist, a heat treatment step carried out in an inert gas atmosphere for a predetermined time at a predetermined temperature between the step of forming a gate insulation layer and the step of heat-treatment in an atmosphere containing $H_2$ (hydrogen) gas or $H_2O$ (water) vapor.

The fifth gist of the invention is that in addition to any one of the first gist to fourth gist, the heat-treatment step carried out in an atmosphere containing $H_2O$ (water) vapor following the step of forming the gate insulation layer can be one carried out for a predetermined time at a predetermined temperature of from 650° C. to 950° C.

The sixth gist of the invention is that in addition to the first gist to the fifth gist, the gate insulation layer can be formed by the semiconductor substrate thermal oxidation method The seventh gist of the invention is that in addition to the sixth gist, the semiconductor substrate thermal oxidation method can be carried out in an atmosphere containing $H_2O$ (water) vapor.

The eighth gist of the invention its that in addition to the seventh gist, the atmosphere containing $H_2O$ can be comprised of $H_2O$, oxygen and inert gas in which the $H_2O$ has a predetermined concentration of from 1% to 100%.

The ninth gist of the invention is that in addition to any one of the first gist to the fifth gist, or either the seventh gist or the eighth gist, the $H_2O$ (water) vapor can be produced by reacting $H_2$ (hydrogen) gas and $O_2$ (oxygen) gas in the atmosphere in which the semiconductor substrate is placed.

The tenth gist of the invention is that in addition to the ninth gist, the ratio $[O_2]/[H_2]$ between a flow rate $[H_2]$ of $H_2$ (hydrogen) gas and a flow rate $[O_2]$ of $O_2$ (oxygen) gas can be within a predetermined range of from 0.1 to 100.

The eleventh gist of the invention is that in addition to any one of the first gist to the tenth gist, the semiconductor substrate oxidation temperature can be in a predetermined range of from 1000° C. to 1250° C.

The twelfth gist of the invention is that in addition to any one of the sixth gist to the eleventh gist, when, following gate oxidation layer formation by thermal oxidation of the semiconductor substrate, the substrate is heat-treated in an atmosphere containing $H_2O$, the heat treatment can be carried out at a temperature that is lower than the temperature at which the gate oxidation layer was formed, increasing the thickness of the gate oxidation layer.

The thirteenth gist of the invention is that in addition to any one of the first gist to the twelfth gist, the temperature at which the heat treatment is carried out in an atmosphere containing $H_2$ (hydrogen) can be in a predetermined range of from 600° C. to 900° C.

The fourteenth gist of the invention is that in addition to any one of the first gist to the thirteenth gist, formation of the gate insulation layer and the following heat treatment in an atmosphere of $H_2$ (hydrogen) gas, $H_2O$ (water) vapor or inert gas can be carried out as a continuous process inside an apparatus shut off from the outside air.

The fifteenth gist of the invention is that in addition to any one of the first gist to the fourteenth gist, the step of cleaning the surface of the semiconductor region can include a step of using ultraviolet irradiation to clean the semiconductor region placed in an ozone atmosphere.

The sixteenth gist of the invention is that in addition to any one of the first gist to the fifteenth gist, the step of cleaning the surface of the semiconductor region can also include a step of cleaning by heat treatment in a $H_2$ (hydrogen) atmosphere.

The seventeenth gist of the invention is that in addition to the sixteenth gist, the step of cleaning the surface of the semiconductor region can also include a step of using ultraviolet irradiation to clean the semiconductor region placed in an ozone atmosphere, followed by a step of cleaning the semiconductor region by heat treatment in a $H_2$ (hydrogen) atmosphere.

The eighteenth gist of the invention is that in addition to any one of the first gist to the seventeenth gist, the method of manufacturing a semiconductor device can also include a step of etching the semiconductor surface, using an (11-20) face formed by etching an (0001) face perpendicularly to the depth direction.

The nineteenth gist of the invention is that in addition to the steps included in any one of the first gist to the eighteenth gist of the above method of manufacturing a semiconductor device can also include a step of forming inter-layer insulation layer, a step of forming a wiring layer and a step of forming an insulation layer that protects the wiring layer.

The twentieth gist of the invention is that in addition to any one of the first gist to the nineteenth gist, the heat treatment in an atmosphere containing $H_2$ (hydrogen) can be carried out after forming a gate electrode film on a layer that is higher than the gate insulation layer.

The twenty-first gist of the invention is that in or in addition to any one of the first gist to the twentieth gist, the method can also include a step of heat-treating in an atmosphere containing $H_2$ (hydrogen), and this can also be followed by a step of heat-treating in an inert gas atmosphere at up to 600° C.

DESCRIPTION OF THE PREFERRED EMBODIMENT

Embodiments of the present invention will now be described in detail with reference to the drawings, starting with a specific example of the method of manufacturing a semiconductor device that will be described with reference to FIG. 1.

Figure 1:
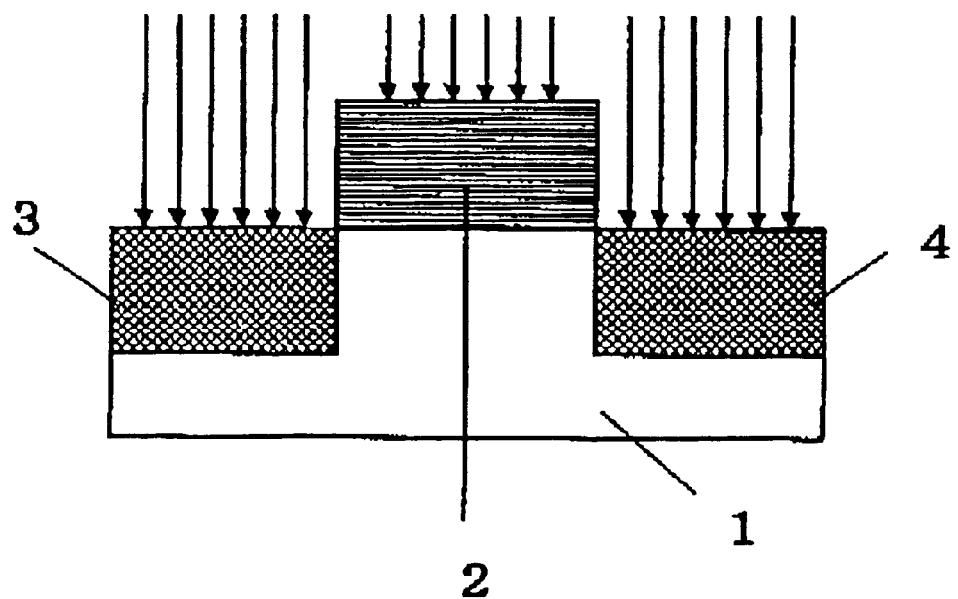
FIG. 1 is a schematic view illustrating a method of manufacturing a MOSFET.
Figure 1:
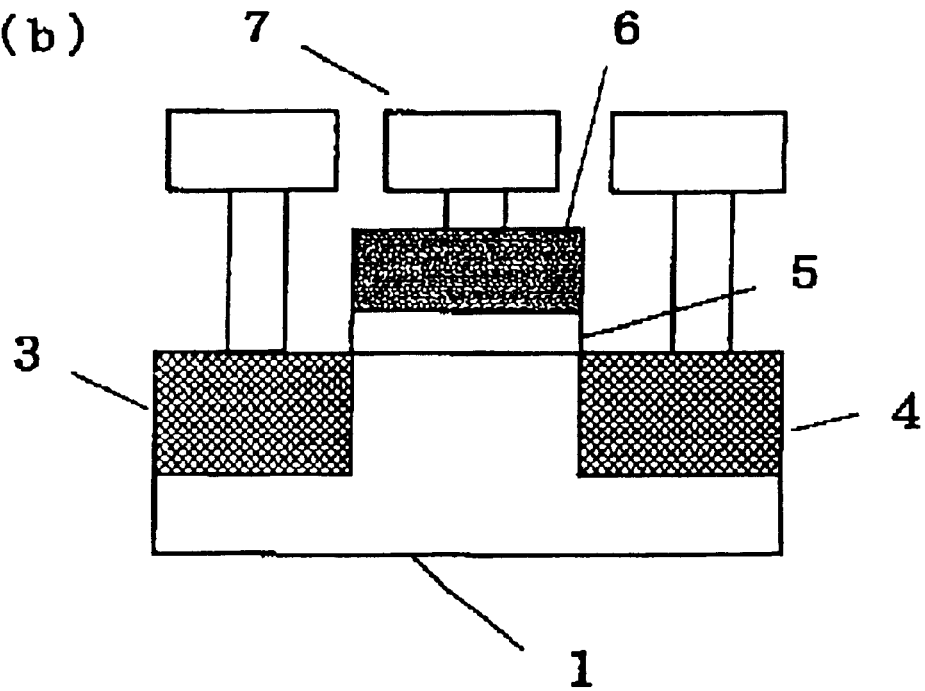

FIG. 1 is a cross-sectional view of an example of a fabrication process used to manufacture a MOS transistor, using a produced SiC substrate, shown partway through the fabrication procedure. FIG. 1(a) shows the state arrived at after a p-type SiC substrate 1 (4H-SiC, impurity concentration of $5 \times 10^{15}$ cm$^{-3}$) having an (11-20) face orientation has been cleaned using standard RCA cleaning and then RIE (Reactive ion etching) has been used to form photolithography alignment marks on the p-type SiC substrate 1. It is also possible to use as the SiC substrate a SiC layer grown on a silicon substrate.

With reference to FIG. 1(b), source and drain regions were formed by ion implantation, using a mask 2 of thermal oxidation film or of $SiO_2$ formed by CVD (Chemical Vapor Deposition). In the case of FIG. 1(b), the ion implantation mask was formed of LTO (Low Temperature Oxide). The LTO layer was formed by reacting silane and oxygen at 400° C. to 800° C. to deposit silicon dioxide on the substrate 1. After using photolithography to form the drain and source regions, HF (hydrofluoric acid) was used to etch the LTO down to the source and drain regions for the ion implantation. To form the source 4 and drain 3, nitrogen, phosphorus or arsenic ion implantation was performed at 500° C. This is followed by activation heat treatment in an argon atmosphere at a temperature in the range of 1200° C. to 1700° C. In this example, the heat treatment consisted of five minutes at 1500° C. Next, the following were carried out to clean the substrate. 1) HF was used to etch away the sacrificial oxide layer, and 2) the SiC substrate surface was processed by ultraviolet radiation in an ozone atmosphere, followed by 3) 30 minutes of hydrogen processing at 1000° C., with the step of 3) carried out as a continuation of step 2). This was followed by oxidation in gas containing $O_2$ or $H_2O$, at a temperature within the range of 1000° C. to 1250° C., thereby forming the gate insulation layer 5 having a thickness of approximately 50 nm. As the gate insulation layer process, oxidation in which $H_2O$-containing gas is used can be done by a method in which 1) vapor produced by heating $H_2O$ is carried to the SiC substrate by oxygen or an inert gas (argon, nitrogen or helium), or 2) $H_2$ and $O_2$ are combusted to produce $H_2O$. In this example, process 1) or 2) was used to form the thermal oxidation layer. Process 2) was implemented at 1000° C. to 1250° C. In this case too, $H_2O$ can be supplied by a flow of inert gas. For comparison with the thermal oxidation layers, a 50-nm-thick LTO layer was also used to form gate insulation layers. The substrate was then heat-treated in inert gas at a temperature in the range of 1000° C. to 1250° C. and cooled to room temperature. The step of heat-treating in an inert gas can be omitted. The substrate was then heat-treated in an atmosphere containing $H_2$ or $H_2O$. In the case of $H_2$, the heat treatment was carried out at 400° C. to 900° C. In the case of $H_2O$, it is preferable to use a temperature of 650° C. to 950° C. In this example, heat treatment was carried out at 650° C., 750° C., 850° C. and 950° C. All the $H_2O$ used was produced by combusting $H_2$ and $O_2$ at 800° C. The $O_2/H_2$ ratio was adjusted within the range of 1 to 10. In the case of FIG. 1, the ratio was 3. The $H_2O$ can be also be supplied by a flow of inert gas (argon, nitrogen or helium). The substrate is then heat-treated in inert gas at a temperature within the range of 1000° C. to 1250° C. This step of heat-treating in an inert gas can be omitted. The substrate was then heat-treated at a low temperature using $H_2O$, and this was followed by heat treatment using $H_2$. The second heat treatment using $H_2$ or the heat treatment using $H_2O$ can be omitted. In this example, the $H_2O$ treatment was carried out at 650° C. and 850° C. and followed by hydrogen treatment at 800° C.

Next, gate electrode 6 was formed. The gate electrode 6 can be formed of aluminum or n- or p-type polysilicon. On the gate electrode another layer of a silicide, such as $WSi_2$, $MoSi_2$ or TiSi, may be formed. Specifically, the gate electrode is formed through etching the aluminum or n- or p-type polysilicon and the gate insulation layer. A contact hole is then etched in the oxidation layer on the source or drain region. Vapor deposition or the sputtering method is then used to form a metal layer containing nickel, titanium or aluminum, and RIE or wet etching is used to form metal contact line 7. In this example, wet etching was used after aluminum vapor deposition. This was followed by heat treatment in nitrogen to complete the MOSFET.

Figure 2:
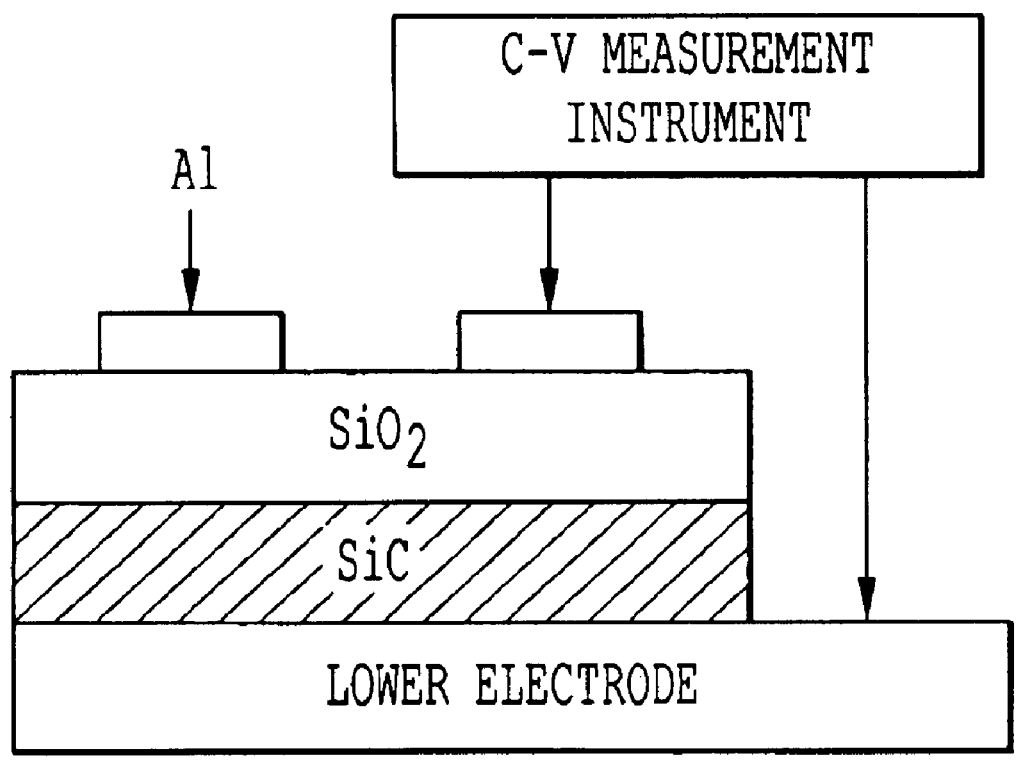
FIG. 2 is a schematic view showing the cross section of a MOS capacitor.

A MOS capacitor was fabricated by forming a 10-nm-thick sacrificial oxide layer on an n-type SiC substrate (4H-SiC, impurity concentration of $5 \times 10^{15}$ cm$^{-3}$) having an (11-20) face orientation that has been cleaned using standard RCA cleaning. The sacrificial oxide layer is removed with 5% hydrofluoric acid, a gate insulation layer is then formed, and the substrate is then heat-treated. The gate insulation layer is formed and the following heat treatment is carried out by the same methods used in the method of manufacturing a MOSFET. The vapor deposition method is then used to form an aluminum layer on the gate insulation layer and on the underside of the SiC substrate, and this is followed by the formation of a metal substrate on the underside, thereby completing the fabrication of a MOS capacitor having the cross-sectional structure shown in FIG. 2.

Figure 3:
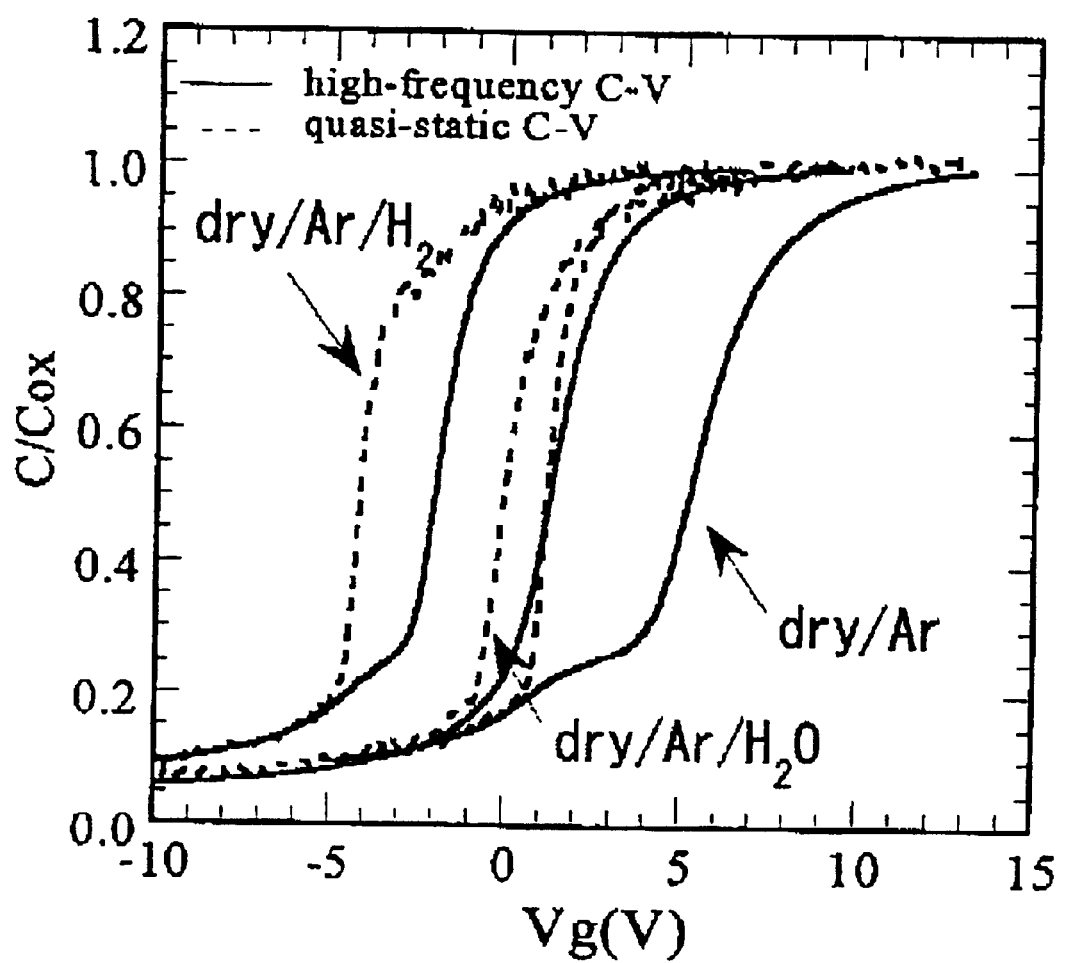
FIG. 3 shows the C-V characteristics of MOS capacitors having a gate insulation layer formed using heat treatment in an atmosphere of dry oxygen and Ar (argon), $H_2$ (hydrogen), and $H_2O$ (water), in which the solid lines show high-frequency C-V characteristics and the broken lines show quasi-static C-V characteristics.
Figure 4:
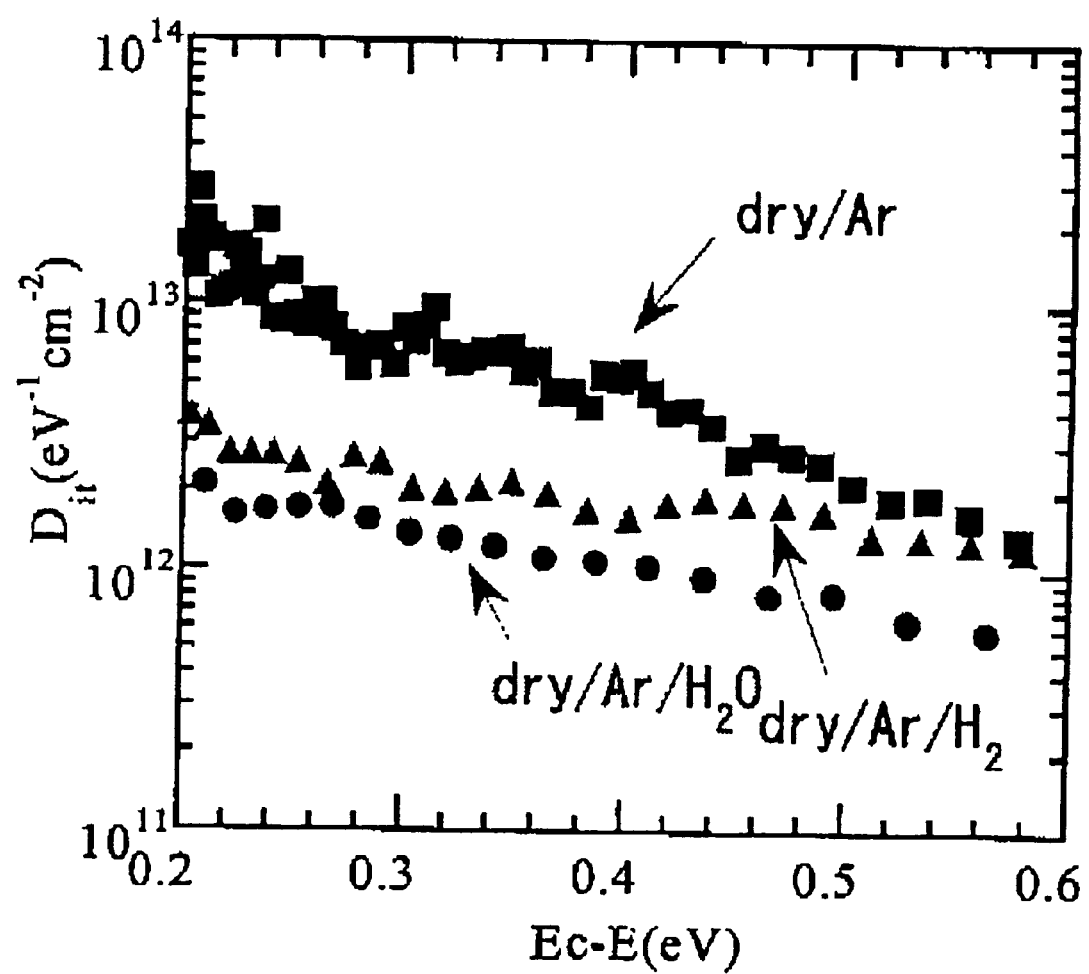
FIG. 4 shows distributions of interface-trap density within the energy gap calculated from the C-V characteristics of FIG. 3.

FIG. 3 shows the high-frequency C-V characteristics (measurement frequency f=100 kHz) and quasi-static C-V characteristics (step voltage Vs=50 mV, delay time td=10 seconds) of sample MOS capacitors that, after having a gate insulation layer formed in dry oxygen, were given 30 minutes of heat treatment at 1150° C. in an argon atmosphere, followed by 30 minutes of heat treatment at 800° C. in an $H_2$ (hydrogen) atmosphere and three hours of heat treatment at 750° C. in an $H_2O$ (water) atmosphere, measured simultaneously using the capacity-voltage measurement method. The solid lines show high-frequency C-V characteristics and broken lines show the quasi-static C-V characteristics. A larger difference in capacitance between the two C-V characteristics indicates a larger interface-trap density ($D_{it}$). FIG. 4 shows distributions of interface-trap density within the energy band calculated from the C-V characteristics of FIG. 3 by means of equation 1. Here, $C_h$ is high-frequency capacitance, $C_q$ is quasi-static capacitance, $C_{ox}$ is oxide layer capacitance, and q is the electronic charge.

$$D_{it} = \frac{1}{q}\left[\left(\frac{1}{C_q} - \frac{1}{C_{OX}}\right)^{-1} - \left(\frac{1}{C_h} - \frac{1}{C_{OX}}\right)^{-1}\right] \quad \text{(Equation 1)}$$

FIG. 4 shows the interface-trap densities of samples that, after formation of the gate insulation layer in dry oxygen, were given 30 minutes of heat treatment at 1150° C. in an argon atmosphere, followed by 30 minutes of heat treatment at 800° C. in an $H_2$ atmosphere and three hours of heat treatment at 750° C. in an $H_2O$ atmosphere.

Figure 5:
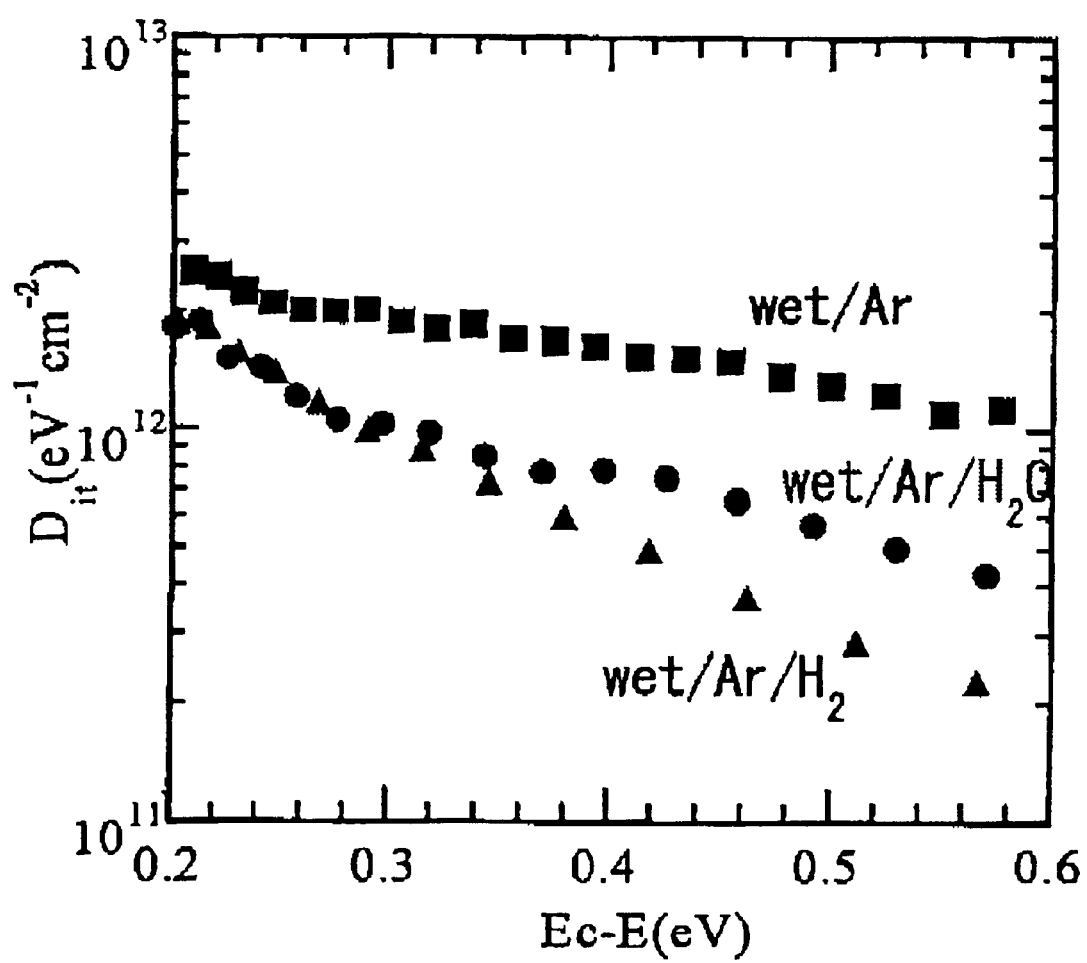
FIG. 5 shows distributions or interface-trap density within the energy gap calculated from the C-V characteristics of MOS capacitors having a gate insulation layer formed using oxidation in an $H_2O$ atmosphere and heat treatment in an atmosphere of Ar, $H_2$, and $H_2O$.
Figure 6:
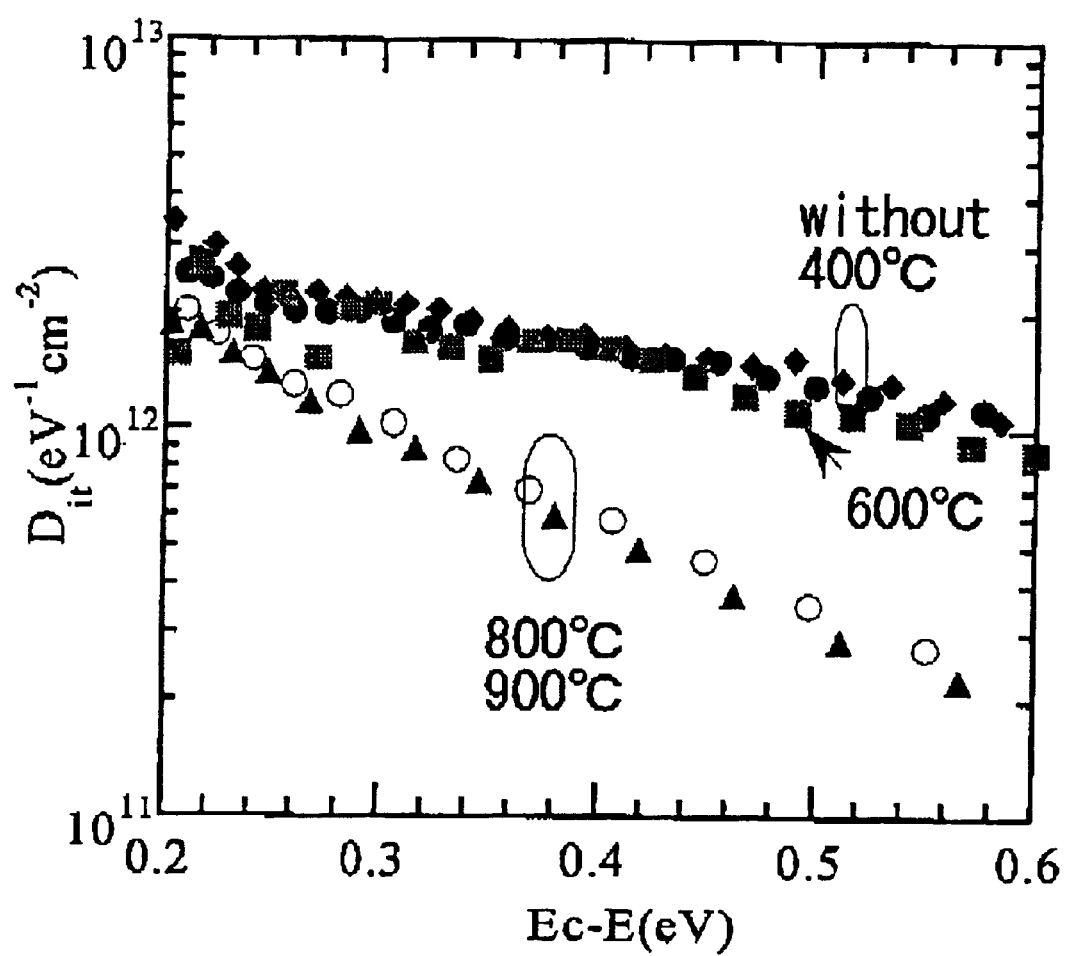
FIG. 6 shows interface-trap density values obtained at hydrogen-heat-treatment temperatures ranging from 400° C. to 900° C., following oxidation in an $H_2O$ atmosphere and heat treatment in argon.

FIG. 5 shows the distributions of the interface-trap densities of samples that, after having a gate insulation layer formed in an $H_2O$ atmosphere, were given 30 minutes of heat treatment at 1150° C. in an argon atmosphere, followed by 30 minutes of heat treatment at 800° C. in an $H_2$ and three hours of heat treatment at 750° C. in an $H_2O$ atmosphere. The interface-trap density was reduced by heat treatment in $H_2$ and $H_2O$ atmospheres, showing that heat treatment in $H_2$ and $H_2O$ atmospheres does have the effect of lowering the interface-trap density. Oxidation in an $H_2O$ atmosphere followed by heat treatment in hydrogen produced the greatest reduction in interface-trap density. FIG. 6 shows interface-trap densities obtained at hydrogen-heat-treatment temperatures ranging from 400° C. to 900° C., following oxidation in an $H_2O$ atmosphere and heat-treatment in argon. Up to 600° C. there is no change, but from 600° C. there is a sharp reduction, and front 800° C. there is saturation. At high temperatures over 900° C. the hydrogen reduces the gate insulation layer, degrading layer reliability, so the temperature of the heat treatment in hydrogen is limited to 600° C. to 900° C.

Figure 7:
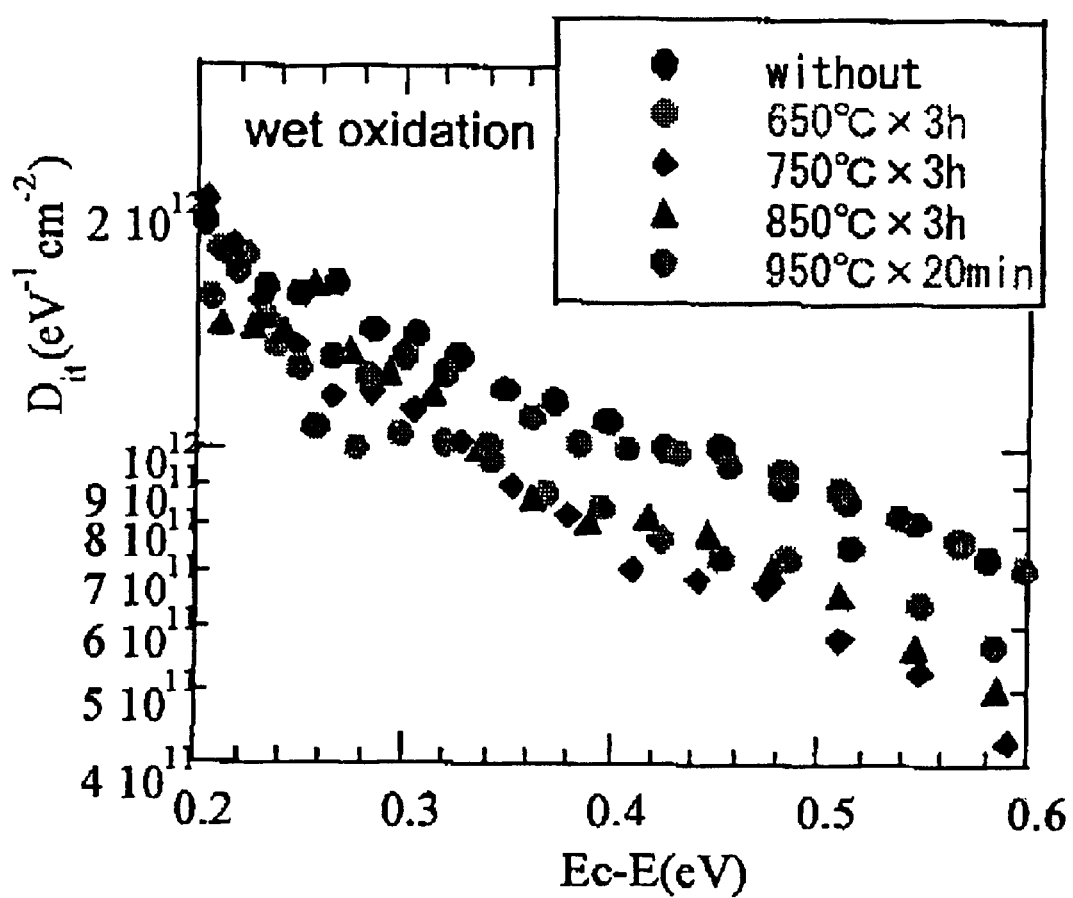
FIG. 7 shows interface-trap density values obtained at $H_2O$-heat-treatment temperatures of 650° C., 750° C., 850° C. and 950° C., following formation of the gate oxidation layer in an $H_2O$ atmosphere and heat treatment in argon.

FIG. 7 shows interface-trap densities obtained at $H_2O$-heat-treatment temperatures of 650° C., 750° C., 850° C. and 950° C., following formation of the gate oxidation layer in an $H_2O$ atmosphere and heat-treatment in argon. The length of the heat treatment was three hours at each temperature except 950° C., which was 20 minutes. At 650° C., the interface-trap density is lower than when no $H_2O$-based treatment is used, showing there was an effect. At 950° C. and above, the interface-trap density is more or less the same as when no $H_2O$ treatment is used, so the upper limit is set at 950° C. The interface-trap density was lowest in the case of 750° C., so 750° C. is the most desirable temperature to use.

Figure 8:
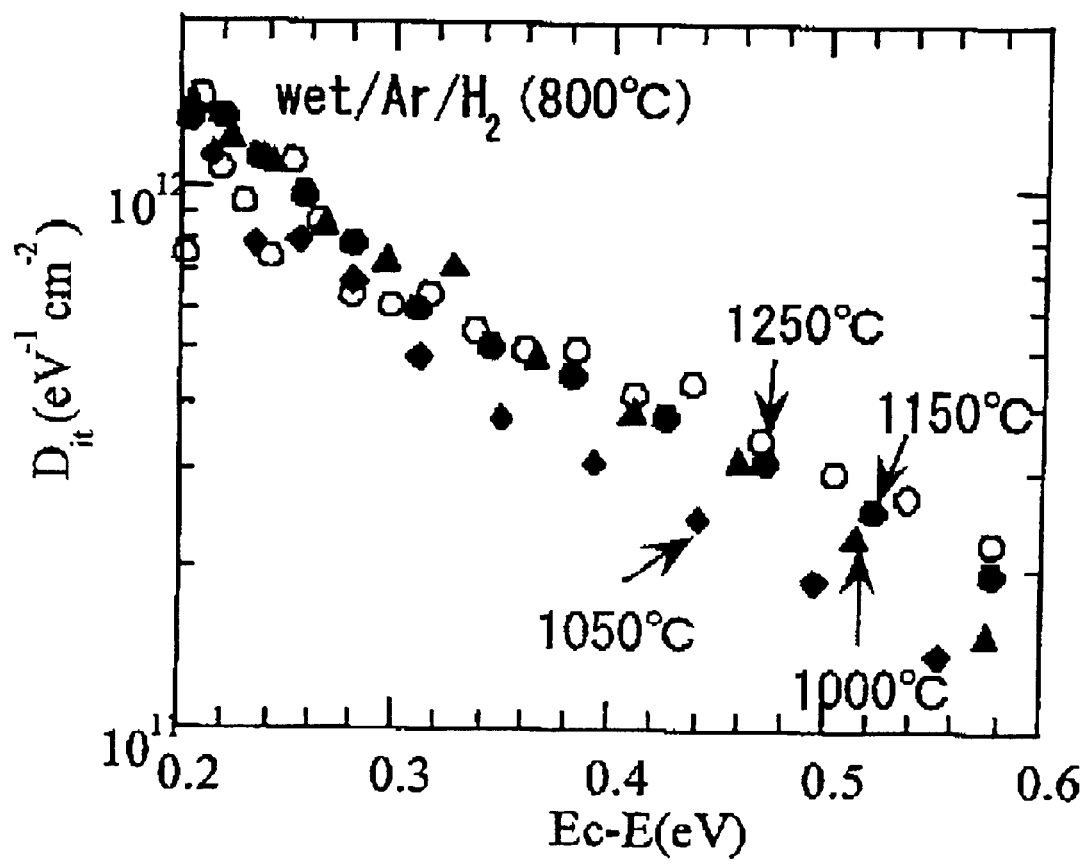
FIG. 8 shows the effect of oxidation temperature on interface-trap density when the substrate has been heat-treated at 800° C. in hydrogen, following formation of the gate oxidation layer in an $H_2O$ atmosphere and heat treatment in an argon atmosphere.
Figure 10:
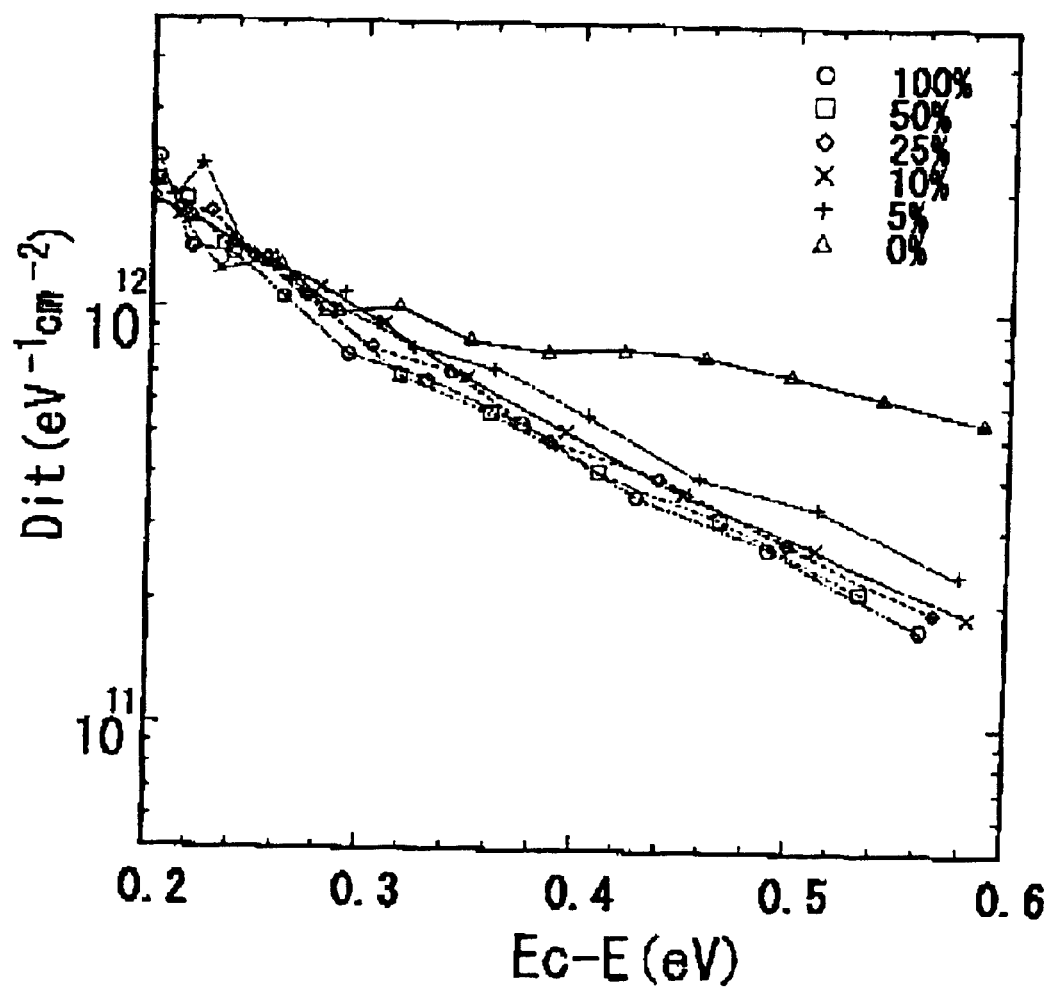
FIG. 10 shows how the interface-trap density ($D_{it}$) is affected by the hydrogen concentration during heat-treatment in hydrogen following formation of the gate oxidation layer.

FIG. 8 shows the effect of oxidation temperature on interface-trap density when the substrate has been heat-treated at 800° C. in hydrogen, following formation of the gate oxidation layer in an $H_2O$ atmosphere and heat treatment in an argon atmosphere. The quartz tube used cannot withstand temperatures exceeding 1250° C. or higher, so the upper limit is set at 1250° C. The interface-trap density was lower at 1150° C. than at 1250° C. The interface-trap density at 1000° C. was substantially the same as at 1150° C., so the lower limit is set at 1000° C. As can be seen, the interface-trap density is lowest at 1050° C., so that temperature is the most desirable to use. FIG. 10 shows how the interface-trap density ($D_{it}$) is affected by the hydrogen concentration during heat-treatment in hydrogen after gate insulation layer formation. It can be seen from the figure that there is an effect at a hydrogen concentration of 5% or more. Based on the proportional distribution between hydrogen concentrations of 0% and 5%, it is estimated that the effect becomes pronounced starting at a concentration in the order of 3%.

Figure 9:
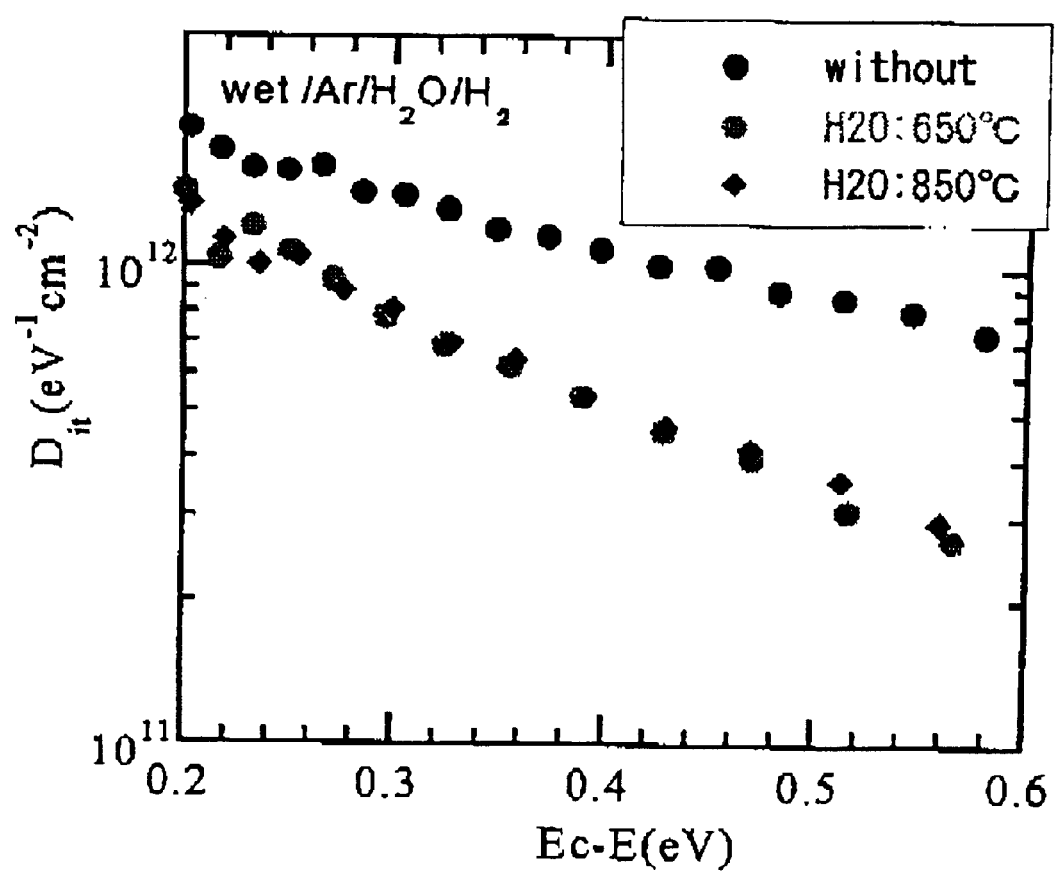
FIG. 9 shows interface-trap density when the substrate has been heat-treated at 800° C. in hydrogen, following formation or the gate oxidation layer in an $H_2O$ atmosphere, heat treatment in an argon atmosphere, and $H_2O$ treatment at a lower temperature (650° C. and 850° C.) than the gate oxidation layer formation temperature.
Figure 11:
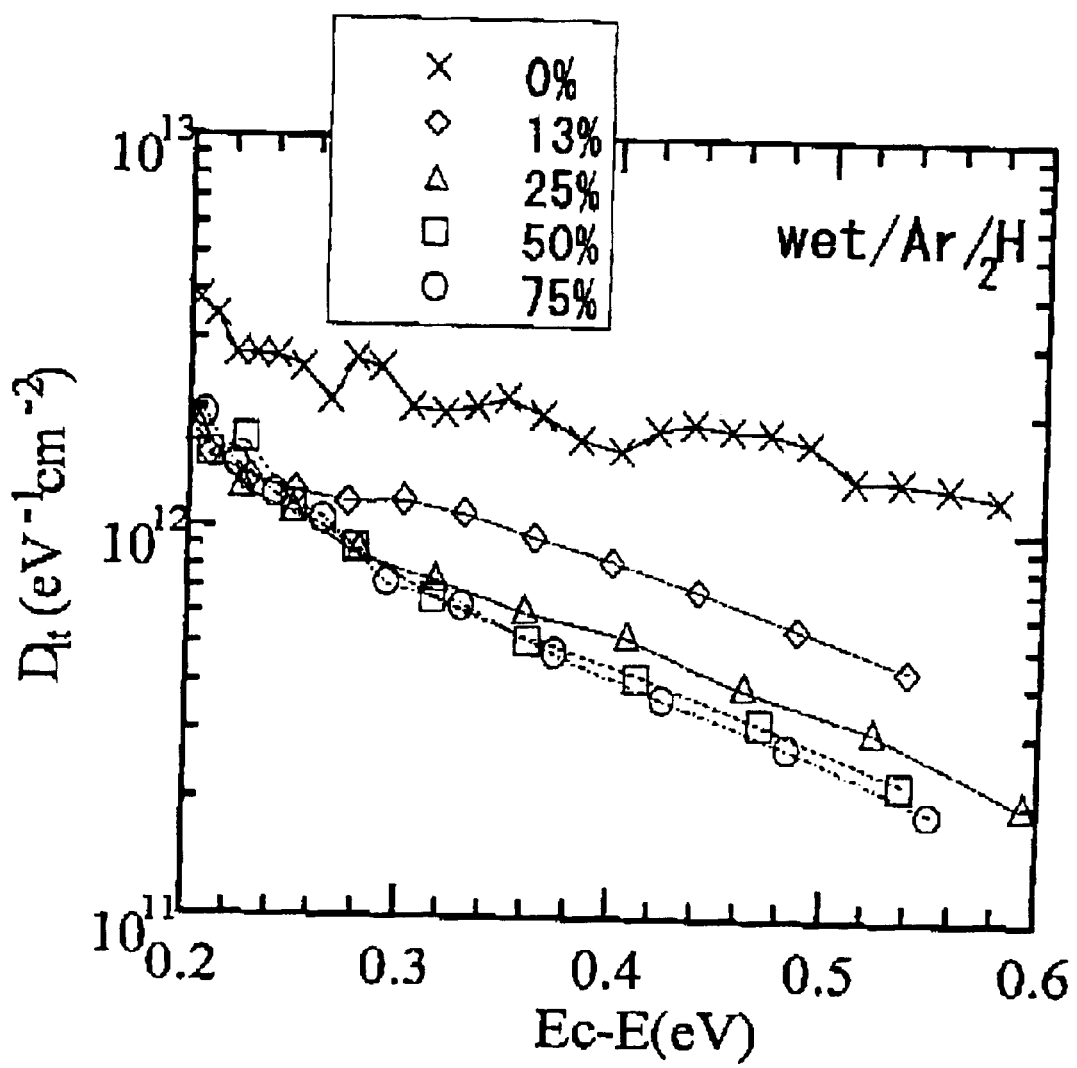
FIG. 11 shows how the interface-trap density ($D_{it}$) is affected by the $H_2O$ concentration during heat-treatment in hydrogen following formation of the gate oxidation layer.

FIG. 9 shows interface-trap density when the substrate has been heat-treated at 800° C. in hydrogen, following formation of the gate oxidation layer in an $H_2O$ atmosphere, heat treatment in an argon atmosphere, and $H_2O$ treatment at lower temperatures (650° C. and 850° C.) than the gate oxidation layer formation temperature. The interface-trap density is lowered more than when the gate oxidation layer is formed using just an $H_2O$ atmosphere, confirming the effect. FIG. 11 shows how the interface-trap density ($D_{it}$) is affected by the $H_2O$ concentration during heat-treatment in hydrogen following gate insulation layer formation. In the figure, it can be seen that there is an effect at an $H_2O$ concentration of 13% or more. Based on the proportional distribution between hydrogen concentrations of 0% and 13%, it is estimated that the effect becomes pronounced starting at a concentration in the order of 5%.

Using the results thus obtained, Table 1 shows the relationship between gate insulation layer formation conditions, post-oxidation heat-treatment conditions and MOSFET channel mobility.

TABLE 1

| Gate oxidation layer formation method | Heat-treatment method after gate oxidation formation | | |
|---|---|---|---|
| | Ar | Ar + $H_2O$ | Ar + $H_2$ |
| Dry oxygen | 2.5 cm²/Vs | 40 cm²/Vs | |
| $H_2O$ (water) atmosphere | 30 cm²/Vs | 65 cm²/Vs | 110 cm²/Vs |

Thus, it can be seen that channel mobility is dramatically improved by heat treatment in either an $H_2O$ or $H_2$ atmosphere, after the gate insulation layer has been formed in dry oxygen or an $H_2O$ atmosphere. In particular, a channel mobility of 110 cm²/Vs was obtained when the gate insulation layer was formed in an $H_2O$ atmosphere followed by heat treatment in $H_2$. This is fully adequate channel mobility for dramatically decreasing the on-resistance of a power MOSFET.

Table 2 shows the results of a comparison between gate insulation layers formed using LTO and thermal oxidation. In the table, in both cases post-oxidation annealing (POA) was carried out in argon (Ar) gas. The results show that a thermal oxidation layer has the effect of improving the channel mobility.

TABLE 2

| Gate oxidation layer | Channel mobility |
|---|---|
| LTO layer | <10 cm²/Vs |
| Thermal oxidation layer | 30 cm²/Vs |

Next, Table 3 shows the results obtained when pure water was heated to produce $H_2O$ vapor that was carried by argon gas to oxidize the SiC substrate, and when the substrate was oxidized using $H_2O$ that was produced by the combustion at $H_2$ and $O_2$ and carried to the substrate by argon gas. The gate insulation layer was formed using a temperature of 1150° C. for 30 minutes. From the results, it can be seen that channel mobility was higher using Hit produced by the combustion of $H_2$ and $O_2$, showing there was a channel mobility improvement effect.

TABLE 3

| $H_2O$ generation method | Channel mobility |
|---|---|
| Vaporization of pure water | <10 cm²/Vs |
| Combustion of $H_2$ and $O_2$ | 30 cm²/Vs |

Table 4 shows the effect that cleaning has on channel mobility. The gate insulation layer was formed using a temperature of 1150° C. for 30 minutes.

TABLE 4

| Substrate cleaning method | Channel mobility |
|---|---|
| None | 30 cm²/Vs |
| Ultraviolet radiation in ozone | 35 cm²/Vs |
| Hydrogen annealing | 37 cm²/Vs |
| Ultraviolet radiation in ozone + hydrogen annealing | 40 cm²/Vs |

These results show that channel mobility is higher when the substrate is cleaned than when the substrate is not cleaned. Channel mobility was 35 cm²/Vs after cleaning using ultraviolet radiation in ozone, 37 cm²/Vs after cleaning by hydrogen annealing and 40 cm²/Vs after cleaning by ultraviolet radiation in ozone plus hydrogen annealing. This shows that channel mobility is enhanced by cleaning by ultraviolet radiation in ozone, cleaning by hydrogen annealing and cleaning by ultraviolet radiation in ozone combined with hydrogen annealing.

Effects of the Invention

The effects of the invention configured as described in the foregoing are as follows.

In the first gist, channel mobility can be improved by forming a gate insulation layer on a semiconductor substrate on which an area of SiC having an (11-20) face orientation is formed, followed by heat-treating the gate insulation layer in an atmosphere containing $H_2$ (hydrogen) or $H_2O$ (water).

In the second or third gist, channel mobility can be improved by forming a gate insulation layer on a semiconductor substrate on which an area of SiC having an (11-20) face orientation is formed, followed by heat treatment in an atmosphere containing $H_2$ or $H_2O$ in a concentration of from 1% to 100%.

In the fourth gist, channel mobility can be improved by, in addition to the first, second or third gist, forming a gate insulation layer, followed by heat treatment in an inert atmosphere before the heat treatment in an atmosphere containing $H_2$ or $H_2O$.

In the fifth gist, in addition to the first or fourth gist, the heat treatment step following the formation of the gate insulation layer is carried out in an atmosphere containing $H_2O$ (water) vapor at a temperature of 650° C. to 950° C. This makes it possible to reduce the thickening of the gate insulation layer to a point where it can be ignored.

In the sixth gist, in addition to any one of the first gist to the fifth gist, thermal oxidation is used to form the gate insulation layer, thereby enabling channel mobility to be improved.

In the seventh gist, channel mobility can be improved, in addition to the sixth gist, by performing thermal oxidation in an atmosphere containing $H_2O$ vapor.

In the eighth gist, channel mobility can be improved, in addition to the seventh gist, by using an atmosphere containing $H_2O$ comprised of $H_2O$, oxygen and inert gas, in which the $H_2O$ has a predetermined concentration of 1% to 100%.

In the ninth gist, $H_2O$ vapor produced by combusting $H_2$ and $O_2$ (oxygen) is used in addition to any one of the first gist to the eighth gist, thereby suppressing the introduction of impurities. This enables channel mobility to be improved.

In the tenth gist, $H_2O$ is produced, in addition to the ninth gist, using a ratio $[O_2]/[H_2]$ between a flow rate $[H_2]$ of $H_2$ (hydrogen) gas and a flow rate $[O_2]$ of $O_2$ (oxygen) gas that is within a predetermined range of 0.1 to 100, thereby enabling channel mobility to be improved.

In the eleventh gist, channel mobility can be improved, in addition to any one of the first gist to the tenth gist, using a semiconductor substrate oxidation temperature in the predetermined range of 1000° C. to 1250° C.

In the twelfth gist, the heat treatment of the substrate is carried out in an atmosphere containing $H_2O$ at a temperature that is lower than the temperature at which the gate oxidation layer was formed, in addition to any one of the sixth gist to the eleventh gist, thereby enabling channel mobility to be improved without increasing the thickness of the gate oxidation layer.

In the thirteenth gist, channel mobility can also be improved by carrying out the heat treatment in an atmosphere containing $H_2$ (hydrogen) at a predetermined temperature within the range of 600° C. to 900° C., in addition to any one of the first gist to the twelfth gist, making it possible to avoid using hydrogen-based etching and the like.

In the fourteenth gist, channel mobility can be improved by forming the gate insulation layer and carrying out the following heat treatment in an atmosphere of $H_2$ (hydrogen) gas, $H_2O$ (water) vapor or inert gas as a continuous process inside an apparatus shut off from the outside air, in addition to any one of the first gist to the thirteenth gist.

In the fifteenth gist, channel mobility can be improved by using a process of cleaning the surface of the semiconductor region that includes a step of cleaning by ultraviolet irradiation of the semiconductor region in an ozone atmosphere, in addition to any one of the first gist to the fourteenth gist.

In the sixteenth gist, channel mobility can be improved by using a process of cleaning the surface of the semiconductor region that includes a step of cleaning the surface of the semiconductor region by heat treatment in a $H_2$ (hydrogen) atmosphere, in addition to any one of the first gist to the fifteenth gist.

In the seventeenth gist, channel mobility can be improved by using a process of cleaning the surface of the semiconductor region that includes a step of cleaning the surface of the semiconductor region by ultraviolet irradiation of the semiconductor region placed in an ozone atmosphere, followed by a step of cleaning by heat treatment in a $H_2$ (hydrogen) atmosphere, in addition to the sixteenth gist.

The eighteenth gist includes a step of etching the semiconductor surface, using an (11-20) face formed by etching a (0001) face perpendicularly to the depth direction thereof, in addition to any one of the first gist to the seventeenth gist, making it possible to further reduce surface crystal defects to enable channel mobility to be improved.

The nineteenth gist includes a step of forming inter-layer insulation layer, a step of forming a wiring layer and a step of forming an insulation layer that protects the wiring layer, in addition to the steps included in any one of the first gist to the eighteenth gist, making it possible to realize SiC devices, electronic circuits and power devices having a sufficiently low on-resistance In the twentieth gist, channel mobility can be improved by carrying out the heat treatment in an atmosphere containing $H_2$ (hydrogen) after forming a gate electrode film on a layer that is higher than the gate insulation layer, in addition to any one of the first gist to the nineteenth gist, thereby preventing contamination of the gate insulation layer.

The twenty-first gist includes a step of heat-treating in an atmosphere containing $H_2$, followed by a step of heat-treating in an inert gas atmosphere at up to 600° C. in or in addition to any one of the first gist to the twentieth gist, thereby enabling channel mobility to be improved.

What is claimed is:

1. A method of manufacturing a semiconductor device, comprising a step of forming a gate insulation layer on a semiconductor region; a step of forming a gate electrode on the gate insulation layer; and a step of forming an electrode on the semiconductor region; the semiconductor region being formed of SiC having an (11-20) face orientation; the method further comprising a step of cleaning a surface of the semiconductor region before the step of forming the gate insulation layer; and a step of heat-treating the gate insulation layer for annealing in an atmosphere containing $H_2$ (hydrogen) or $H_2O$ (water) vapor after the step of forming the gate insulation layer, thereby reducing interface-trap density of an interface between the gate insulation layer and the semiconductor region.

2. A method according to claim 1, wherein the atmosphere containing $H_2$ (hydrogen) is a mixture of $H_2$ (hydrogen) and inert gas in which the $H_2$ (hydrogen) has a predetermined concentration of from 1% to 100%.

3. A method according to claim 1, wherein the atmosphere containing $H_2O$ (water) vapor is a mixture of $H_2O$ (water) vapor and inert gas in which the $H_2O$ (water) vapor has a predetermined concentration of from 1% to 100%.

4. A method according to claim 1 that includes a heat-treatment step carried out in an inert gas atmosphere for a predetermined time at a predetermined temperature between the step of forming the gate insulation layer and the step of heat-treating the gate insulation layer in the atmosphere containing $H_2$ (hydrogen) gas or $H_2O$ (water) vapor.

5. A method according to claim 2 that includes a heat-treatment step carried out in an inert gas atmosphere for a predetermined time at a predetermined temperature between the step of forming the gate insulation layer and the step of heat-treating the gate insulation layer in the atmosphere containing $H_2$ (hydrogen) gas or $H_2O$ (water) vapor.

6. A method according to claim 3 that includes a heat-treatment step carried out in an inert gas atmosphere for a predetermined time at a predetermined temperature between the step of forming the gate insulation layer and the step of heat-treating the gate insulation layer in the atmosphere containing $H_2$ (hydrogen) gas or $H_2O$ (water) vapor.

7. A method according to claim 1, wherein the step of heat-treating the gate insulation layer in the atmosphere containing $H_2O$ (water) vapor is carried out for a predetermined time at a predetermined temperature of from 650° C. to 950° C.

8. A method according to claim 3, wherein the step of heat-treating the gate insulation layer in the atmosphere containing $H_2O$ (water) vapor is carried out for a predetermined time at a predetermined temperature of from 650° C. to 950° C.

9. A method according to claim 4, wherein the step of heat-treating the gate insulation layer in the atmosphere containing $H_2O$ (water) vapor is carried out for a predetermined time at a predetermined temperature of from 650° C. to 950° C.

10. A method according to claim 1, further comprising a step of thermally oxidizing a semiconductor substrate in an atmosphere containing $H_2O$ (water) vapor to form a gate oxidation layer before the annealing step, wherein the $H_2O$ (water) vapor is produced by reacting $H_2$ (hydrogen) gas and $O_2$ (oxygen) gas in an atmosphere in which the semiconductor substrate is placed and wherein the atmosphere containing $H_2O$ vapor is formed of $H_2O$ vapor, oxygen and inert gas in which the $H_2O$ vapor has a concentration of from 1% to 100%.

11. A method according to claim 2, further comprising a step of thermally oxidizing a semiconductor substrate in an atmosphere containing $H_2O$ (water) vapor to form a gate oxidation layer before the annealing step, wherein the $H_2O$ (water) vapor is produced by reacting $H_2$ (hydrogen) gas and $O_2$ (oxygen) gas in an atmosphere in which the semiconductor substrate is placed and wherein the atmosphere containing $H_2O$ vapor is formed of $H_2O$ vapor, oxygen and inert gas in which the $H_2O$ vapor has a concentration of from 1% to 100%.

12. A method according to claim 3, further comprising a step of thermally oxidizing a semiconductor substrate in ail atmosphere containing $H_2O$ (water) vapor to form a gate oxidation layer before the annealing step, wherein the $H_2O$ (water) vapor is produced by reacting $H_2$ (hydrogen) gas and $O_2$ (oxygen) gas in an atmosphere in which the semiconductor substrate is placed and wherein the atmosphere containing $H_2O$ vapor is formed of $H_2O$ vapor, oxygen and inert gas in which the $H_2O$ vapor has a concentration of from 1% to 100%.

13. A method according to claim 4, further comprising a step of thermally oxidizing a semiconductor substrate in an atmosphere containing $H_2O$ (water) vapor to form a gate oxidation layer before the annealing step, wherein the $H_2O$ (water) vapor is produced by reacting $H_2$ (hydrogen) gas and $O_2$ (oxygen) gas in an atmosphere in which the semiconductor substrate is placed and wherein the atmosphere containing $H_2O$ vapor is formed of $H_2O$ vapor, oxygen and inert gas in which the $H_2O$ vapor has a concentration of from 1% to 100%.

14. A method according to claim 7, further comprising a step of thermally oxidizing a semiconductor substrate in an atmosphere containing $H_2O$ (water) vapor to form a gate oxidation layer before the annealing step, wherein the $H_2O$ (water) vapor is produced by reacting $H_2$ (hydrogen) gas and $O_2$ (oxygen) gas in an atmosphere in which the semiconductor substrate is placed and wherein the atmosphere containing $H_2O$ vapor is formed of $H_2O$ vapor, oxygen and inert gas in which the $H_2O$ vapor has a concentration of from 1% to 100%.

15. A method according to claim 8, further comprising a step of thermally oxidizing a semiconductor substrate in an atmosphere containing $H_2O$ (water) vapor to form a gate oxidation layer before the annealing step, wherein the $H_2O$ (water) vapor is produced by reacting $H_2$ (hydrogen) gas and $O_2$ (oxygen) gas in an atmosphere in which the semiconductor substrate is placed and wherein the atmosphere containing $H_2O$ vapor is formed of $H_2O$ vapor, oxygen and inert gas in which the $H_2O$ vapor has a concentration of from 1% to 100%.

16. A method according to claim 9, further comprising a step of thermally oxidizing a semiconductor substrate in an atmosphere containing $H_2O$ (water) vapor to form a gate oxidation layer before the annealing step, wherein the $H_2O$ (water) vapor is produced by reacting $H_2$ (hydrogen) gas and $O_2$ (oxygen) gas in an atmosphere in which the semiconductor substrate is placed and wherein the atmosphere containing $H_2O$ vapor is formed of $H_2O$ vapor, oxygen and inert gas in which the $H_2O$ vapor has a concentration of from 1% to 100%.

17. A method according to claim 10, wherein a ratio $[O_2]/[H_2]$ between a flow rate $[H_2]$ of the $H_2$ (hydrogen) gas and a flow rate $[O_2]$ of the $O_2$ (oxygen) gas is within a predetermined range of from 0.1 to 100.

18. A method according to claim 11, wherein a ratio $[O_2]/[H_2]$ between a flow rate $[H_2]$ of the $H_2$ (hydrogen) gas and a flow rate $[O_2]$ of the $O_2$ (oxygen) gas is within a predetermined range of from 0.1 to 100.

19. A method according to claim 12, wherein a ratio $[O_2]/[H_2]$ between a flow rate $[H_2]$ of the $H_2$ (hydrogen) gas and a flow rate $[O_2]$ of the $O_2$ (oxygen) gas is within a predetermined range of from 0.1 to 100.

20. A method according to claim 13, wherein a ratio $[O_2]/[H_2]$ between a flow rate $[H_2]$ of the $H_2$ (hydrogen) gas and a flow rate $[O_2]$ of the $O_2$ (oxygen) gas is within a predetermined range of from 0.1 to 100.

21. A method according to claim 14, wherein a ratio $[O_2]/[H_2]$ between a flow rate $[H_2]$ of the $H_2$ (hydrogen) gas and a flow rate $[O_2]$ of the $O_2$ (oxygen) gas is within a predetermined range of from 0.1 to 100.

22. A method according to claim 15, wherein a ratio $[O_2]/[H_2]$ between a flow rate $[H_2]$ of the $H_2$ (hydrogen) gas and a flow rate $[O_2]$ of the $O_2$ (oxygen) gas is within a predetermined range of from 0.1 to 100.

23. A method according to claim 16, wherein a ratio $[O_2]/[H_2]$ between a flow rate $[H_2]$ of the $H_2$ (hydrogen) gas and a flow rate $[O_2]$ of the $O_2$ (oxygen) gas is within a predetermined range of from 0.1 to 100.

24. A method according to claim 17, wherein the thermally oxidizing stop is performed at a temperature in a predetermined range of from 1000° C. to 1250° C.

25. A method according to claim 18 wherein the thermally oxidizing step is performed at a temperature in a predetermined range of from 1000° C. to 1250° C.

26. A method according to claim 19, wherein the thermally oxidizing step is performed at a temperature in a predetermined range of from 1000° C. to 1250° C.

27. A method according to claim 20, wherein the thermally oxidizing step is performed at a temperature in a predetermined range of from 1000° C. to 1250° C.

28. A method according to claim 21, wherein the thermally oxidizing step is performed at a temperature in a predetermined range of from 1000° C. to 1250° C.

29. A method according to claim 22, wherein the thermally oxidizing step is performed at a temperature in a predetermined range of from 1000° C. to 1250° C.

30. A method according to claim 23, wherein the thermally oxidizing step is performed at a temperature in a predetermined range of from 1000° C. to 1250° C.

31. A method according to claim 24, wherein the step of heat-treating the gate insulation layer in the atmosphere containing $H_2$ (hydrogen) is carried out at a temperature in a predetermined range of from 600° C. to 900° C.

32. A method according to claim 25, wherein the step of heat-treating the gate insulation layer in the atmosphere containing $H_2$ (hydrogen) is carried out at a temperature in a predetermined range of from 600° C. to 900° C.

33. A method according to claim 26, wherein the step of heat-treating the gate insulation layer in the atmosphere containing $H_2$ (hydrogen) is carried out at a temperature in a predetermined range of from 600° C. to 900° C.

34. A method according to claim 27, wherein the step of heat-treating the gate insulation layer in the atmosphere containing $H_2$ (hydrogen) is carried out at a temperature in a predetermined range of from 600° C. to 900° C.

35. A method according to claim 28, wherein the step of heat-treating the gate insulation layer in the atmosphere containing $H_2$ (hydrogen) is carried out at a temperature in a predetermined range of from 600° C. to 900° C.

36. A method according to claim 29, wherein the step of heat-treating the gate insulation layer in the atmosphere containing $H_2$ (hydrogen) is carried out at a temperature in a predetermined range of from 600° C. to 900° C.

37. A method according to claim 30, wherein the step of heat-treating the gate insulation layer in the atmosphere containing $H_2$ (hydrogen) is carried out at a temperature in a predetermined range of from 600° C. to 900° C.

38. A method according to claim 32, wherein the step of forming the gate insulation layer and the following step of heat-treating in the atmosphere of $H_2$ gas, $H_2O$ vapor or inert gas are carried out as a continuous process inside an apparatus shut off from outside air.

39. A method according to claim 38, wherein the step of cleaning the surface of the semiconductor region includes a step of using ultraviolet irradiation to clean the semiconductor region placed in an ozone atmosphere.

40. A method according to claim 39, wherein the step of cleaning the surface of the semiconductor region further includes a step of cleaning using heat treatment in a $H_2$ atmosphere.

41. A method according to claim 31 that includes a step of etching the semiconductor surface using an (11-20) face formed by etching a (0001) face perpendicularly to a depth direction of the (0001) face.

42. A method according to claim 32 that includes a step of etching the semiconductor surface using an (11-20) face formed by etching a (0001) face perpendicularly to a depth direction of the (0001) face.

43. A method according to claim 33 that includes a step of etching the semiconductor surface using an (11-20) face formed by etching a (0001) face perpendicularly to a depth direction of the (0001) face.

44. A method according to claim 34 that includes a step of etching the semiconductor surface using an (11-20) face formed by etching a (0001) face perpendicularly to a depth direction of the (0001) face.

45. A method according to claim 5, further comprising a step of thermally oxidizing a semiconductor substrate at a temperature in a predetermined range of from 1000° C. to 1250° C. in an atmosphere containing $H_2O$ (water) vapor to form a gate oxidation layer before the annealing step, wherein the $H_2O$ (water) vapor is produced by reacting $H_2$ (hydrogen) gas and $O_2$ (oxygen) gas in an atmosphere in which the semiconductor substrate is placed, wherein the atmosphere containing $H_2O$ vapor is formed of $H_2·O$ vapor, oxygen and inert gas in which the $H_2O$ vapor has a concentration of from 1% to 100% wherein a ratio $[O_2]/[H_2]$ between a flow rate $[H_2]$ of the $H_2$ (hydrogen) gas and a flow rate $[O_2]$ of the $O_2$ (oxygen) gas is within a predetermined range of from 0.1 to 100, wherein the step of heat-treating the gate insulation layer in the atmosphere containing $H_2$ (hydrogen) is carried out at a temperature in a predetermined range of from 600° C. to 900° C., and further comprising a step of etching the semiconductor surface using an (11-20) face formed by etching a (0001) face perpendicularly to a depth direction of the (0001) face.

46. A method according to claim 31, further comprising a step of forming an inter-layer insulation layer, a step of forming a wiring layer and a step of forming an insulation layer that protects the wiring layer.

47. A method according to claim 32, further comprising a step of forming an inter-layer insulation layer, a step of forming a wiring layer and a step of forming an insulation layer that protects the wiring layer.

48. A method according to claim 33 further comprising a step of forming an inter-layer insulation layer, a step of forming a wiring layer and a step of forming an insulation layer that protects the wiring layer.

49. A method according to claim 34, further comprising a step of forming an inter-layer insulation layer, a step of forming a wiring layer and a step of forming an insulation layer that protects the wiring layer.

50. A method according to claim 5, further comprising a step of thermally oxidizing a semiconductor substrate at a temperature in a predetermined range of from 1000° C. to 1250° C. in an atmosphere containing $H_2O$ (water) vapor to form a gate oxidation layer before the annealing step, wherein the $H_2O$ (water) vapor is produced by reacting $H_2$ (hydrogen) gas and $O_2$ (oxygen) gas in an atmosphere in which the semiconductor substrate is placed, wherein the atmosphere containing $H_2O$ vapor is formed of $H_2O$ vapor, oxygen and inert gas in which the $H_1O$ vapor has a concentration of from 1% to 100%, wherein a ratio $[O_2]/[H_2]$ between a flow rate $[H_2]$ of the $H_2$ (hydrogen) gas and a flow rate $[O_2]$ of the $O_2$ (oxygen) gas is within a predetermined range of from 0.1 to 100, wherein the step of heat-treating the gate insulation layer in the atmosphere containing $H_2$ (hydrogen) is carried out at a temperature in a predetermined range of from 600° C. to 900° C., and further comprising a step of forming an inter-layer insulation layer, a step of forming a wiring layer and a step of forming an insulation layer that protects the wiring layer.

51. A method according to claim 41, further comprising a step of forming inter-layer insulation, a step of forming a wiring layer and a step of forming an insulation layer that protects the wiring layer.

52. A method according to claim 42, further comprising a step of forming inter-layer insulation, a step of forming a wiring layer and a step of forming an insulation layer that protects the wiring layer.

53. A method according to claim 43, further comprising a step of forming inter-layer insulation, a step of forming a wiring layer and a step of forming an insulation layer that protects the wiring layer.

54. A method according to claim 31, wherein the step of heat-treating the gate insulation layer in the atmosphere containing $H_2$ (hydrogen) is carried out after forming a gate electrode film on a layer that is higher than the gate insulation layer.

55. A method according to claim 32, wherein the step of heat-treating the gate insulation layer in the atmosphere containing $H_2$ (hydrogen) is carried out after forming a gate electrode film on a layer that is higher than the gate insulation layer.

56. A method according to claim 5, further comprising a step of thermally oxidizing a semiconductor substrate at a temperature in a predetermined range of from 1000° C. to 1250° C. in an atmosphere containing $H_2O$ (water) vapor to form a gate oxidation layer before the annealing step, wherein the $H_2O$ (water) vapor is produced by reacting $H_2$ (hydrogen) gas and $O_2$ (oxygen) gas in an atmosphere in which the semiconductor substrate is placed, wherein the atmosphere containing $H_2O$ vapor is formed of $H_2O$ vapor, oxygen and inert gas in which the $H_2O$ vapor has a concentration of from 1% to 100%, wherein a ratio $[O_2]/[H_2]$ between a flow rate $[H_2]$ of the $H_2$ (hydrogen) gas and a flow rate $[O_2]$ of the $O_2$ (oxygen) gas is within a predetermined range of from 0.1 to 100, wherein the step of heat-treating the gate insulation layer in the atmosphere containing $H_2$ (hydrogen) is carried out at a temperature in a predetermined range of from 600° C. to 900° C., and wherein the step of heat-treating the gate insulation layer in the atmosphere containing $H_2$ (hydrogen) is carried out after forming a gate electrode film on a layer that is higher than the gate insulation layer.

57. A method according to claim 41, wherein the step of heat-treating the gate insulation layer in the atmosphere containing $H_2$ (hydrogen) is carried out after forming a gate electrode film on a layer that is higher than the gate insulation layer.

58. A method according to claim 42, wherein the step of heat-treating the gate insulation layer in the atmosphere containing $H_2$ (hydrogen) is carried out after forming a gate electrode film on a layer that is higher than the gate insulation layer.

59. A method according to claim 45, wherein the step of heat-treating the gate insulation layer in the atmosphere containing $H_2$ (hydrogen) is carried out after forming a gate electrode film on a layer that is higher than the gate insulation layer.

60. A method according to claim 51, wherein the step of heat-treating the gate insulation layer in the atmosphere containing $H_2$ (hydrogen) is carried out after forming a gate electrode film on a layer that is higher than the gate insulation layer.

61. A method according to claim 52, wherein the step of heat-treating tile gate insulation layer in the atmosphere containing $H_2$ (hydrogen) is carried out after forming a gate electrode film on a layer that is higher than the gate insulation layer.

62. A method according to claim 53, wherein the step of heat-treating the gate insulation layer in the atmosphere containing $H_2$ (hydrogen) is carried out after forming a gate electrode film on a layer that is higher than the gate insulation layer.

63. A method according to claim 31, further comprising a step of heat-treating in an inert gas atmosphere at up to 600° C. that is carried out after the step of heat-treating the gate insulation layer in the atmosphere containing $H_2$ (hydrogen).

64. A method according to claim 32, further comprising a step of heat-treating in an inert gas atmosphere at up to 600° C. that is carried out after tile step of heat-treating the gate insulation layer in the atmosphere containing $H_2$ (hydrogen).

65. A method according to claim 5, further comprising a step of thermally oxidizing a semiconductor substrate at a temperature in a predetermined range of from 1000° C. to 1250° C. in an atmosphere containing $H_2O$ (water) vapor to form a gate oxidation before the annealing step, wherein the $H_2O$ (water) vapor is produced by reacting $H_2$ (hydrogen) gas and $O_2$ (oxygen) gas in an atmosphere in which the semiconductor substrate is placed, wherein the atmosphere containing $H_2O$ vapor is formed of $H_2O$ vapor, oxygen and inert gas in which the $H_2O$ vapor has a concentration of from 1% to 100%, wherein a ratio $[O_2]/[H_2]$ between a flow rate $[H_2]$ of the $H_2$ (hydrogen) gas and a flow rate $[O_2]$ of the $O_2$ (oxygen) gas is within a predetermined range of from 0.1 to 100, and further comprising a step of heat-treating in an inert gas atmosphere at up to 600° C. that is carried out after the step of heat-treating the gate insulation layer in the atmosphere containing $H_2$ (hydrogen).

66. A method according to claim 41, further comprising a step of heat-treating in an inert gas atmosphere at up to 600° C. that is carried out after the step of heat-treating the gate insulation layer in the atmosphere containing $H_2$ (hydrogen).

67. A method according to claim 42, further comprising a step of heat-treating in an inert gas atmosphere at up to 600° C. that is carried out after the step of heat-treating the gate insulation layer in the atmosphere containing $H_2$ (hydrogen).

68. A method according to claim 45, further comprising a step of heat-treating in an inert gas atmosphere at up to 600° C. that is carried out after the step of heat-treating the gate insulation layer in the atmosphere containing $H_2$ (hydrogen).

69. A method according to claim 46, further comprising a step of heat-treating in an inert gas atmosphere at up to 600° C. that is carried out after the step of heat-treating the gate insulation layer in the atmosphere containing $H_2$ (hydrogen).

70. A method according to claim 47, further comprising a step of heat-treating in an inert gas atmosphere at up to 600° C. that is carried out after the step of heat-treating the gate insulation layer in the atmosphere containing $H_2$ (hydrogen).

71. A method according to claim 50, further comprising a step of heat-treating in an inert gas atmosphere at up to 600° C. that is carried out after the step of heat-treating the gate insulation layer in the atmosphere containing $H_2$ (hydrogen).

72. A method according to claim 54, further comprising a step of heat-treating in an inert gas atmosphere at up to 600° C. that is carried out after the step of heat-treating the gate insulation layer in the atmosphere containing $H_2$ (hydrogen).

73. A method according to claim 55, further comprising a step of heat-treating in an inert gas atmosphere at up to 600° C. that is carried out after the step of heat-treating the gate insulation layer in the atmosphere containing $H_2$ (hydrogen).

74. A method according to claim 56, further comprising a step of heat-treating in an inert gas atmosphere at up to 600° C. that is carried out after the step of heat-treating the gate insulation layer in the atmosphere containing $H_2$ (hydrogen).

75. A method according to claim 51, further comprising a step of heat-treating in an inert gas atmosphere at up to 600° C. that is carried out after the step of heat-treating the gate insulation layer in the atmosphere containing $H_2$ (hydrogen).

76. A method according to claim 52, further comprising a step of heat-treating in an inert gas atmosphere at up to 600° C. that is carried out after the step of heat-treating the gate insulation layer in the atmosphere containing $H_2$ (hydrogen).

77. A method according to claim 53, further comprising a step of heat-treating in an inert gas atmosphere at up to 600° C. that is carried out after the step of heat-treating the gate insulation layer in the atmosphere containing $H_2$ (hydrogen).

78. A method according to claim 60, further comprising a step of heat-treating in an inert gas atmosphere at up to 600° C. that is carried out after the step of heat-treating the gate insulation layer in the atmosphere containing $H_2$ (hydrogen).

79. A method according to claim 61, further comprising a step of heat-treating in an inert gas atmosphere at up to 600° C. that is carried out after the step of heat-treating the gate insulation layer in the atmosphere containing $H_2$ (hydrogen).

80. A method according to claim 62, further comprising a step of heat-treating in an inert gas atmosphere at up to 600° C. that is carried out after the step of heat-treating the gate insulation layer in the atmosphere containing $H_2$ (hydrogen).

* * * * *